(12) United States Patent
Endo et al.

(10) Patent No.: US 7,455,950 B2
(45) Date of Patent: Nov. 25, 2008

(54) RESIST MATERIAL AND PATTERN FORMATION METHOD USING THE SAME

(75) Inventors: Masayuki Endo, Osaka (JP); Masaru Sasago, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/702,643

(22) Filed: Feb. 6, 2007

(65) Prior Publication Data

US 2007/0248894 A1 Oct. 25, 2007

(30) Foreign Application Priority Data

Apr. 21, 2006 (JP) ............................. 2006-118035

(51) Int. Cl.
 *G03F 7/00* (2006.01)
 *G03F 7/004* (2006.01)
(52) U.S. Cl. ................... 430/270.1; 430/283.1; 430/311
(58) Field of Classification Search ............... 430/270.1, 430/311, 283.1
See application file for complete search history.

(56) References Cited

U.S. PATENT DOCUMENTS

| | | | | |
|---|---|---|---|---|
| 5,219,934 | A * | 6/1993 | Heger et al. | 525/66 |
| 6,980,277 | B2 * | 12/2005 | Sewell | 355/30 |
| 7,033,728 | B2 * | 4/2006 | Dammel | 430/270.1 |
| 2005/0058935 | A1 * | 3/2005 | Kishimura et al. | 430/270.1 |
| 2005/0186501 | A1 * | 8/2005 | Kishimura et al. | 430/270.1 |

OTHER PUBLICATIONS

Lee, G., et al. "Origin of LER and Its Solution" Proceedings of SPIE, 2005, vol. 5753, pp. 390-399.

* cited by examiner

*Primary Examiner*—Amanda C. Walke
(74) *Attorney, Agent, or Firm*—McDermott Will & Emery LLP

(57) ABSTRACT

A resist material includes a polymeric material made of a unit represented by a general formula of the following Chemical Formula; and an acid generator for generating an acid through irradiation with light:

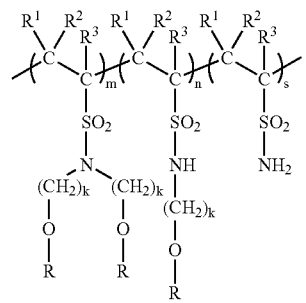

wherein $R^1$, $R^2$ and $R^3$ are the same or different and are a hydrogen atom, a fluorine atom, or a straight-chain alkyl group, a branched or cyclic alkyl group or a fluoridated alkyl group with a carbon number not less than 1 and not more than 20; R is a hydrogen atom, a straight-chain alkyl group, a branched or cyclic alkyl group or a fluoridated alkyl group with a carbon number not less than 1 and not more than 20; $m \geq 0$, $n \geq 0$, $s > 0$ (whereas excluding $m=n=0$) and $1 \leq k \leq 3$.

11 Claims, 3 Drawing Sheets

RESIST MATERIAL AND PATTERN FORMATION METHOD USING THE SAME

CROSS-REFERENCE TO RELATED APPLICATIONS

This application claims priority under 35 U.S.C. §119 on Patent Application No. 2006-118035 filed in Japan on Apr. 21, 2006, the entire contents of which are hereby incorporated by reference.

BACKGROUND OF THE INVENTION

The present invention relates to a resist material suitably used in microprocessing technique for semiconductor devices and a pattern formation method using the same.

Recently, in accordance with the increased degree of integration and the increased operation speed of LSIs, a pattern rule is required to be further refined. The pattern rule has been rapidly refined owing to the increased NA (numerical aperture) of a projection lens, the improved performance of a resist material, the reduced wavelength of exposing light and the like.

Currently, ArF excimer laser (of a wavelength of a 193 nm band) is used as the exposing light for coping with a design rule of 90 nm or less.

Now, a pattern formation method using a conventional resist material will be described with reference to FIGS. 3A through 3D.

First, a positive chemically amplified resist material having the following composition is prepared:

Base polymer: poly((2-methyl-2-adamantyl methacrylate (50 mol %)-γ-butyrolactone methacrylate (40 mol %)-2-hydroxyadamantyl methacrylate (10 mol %)) . . . 2 g.

Acid generator: triphenylsulfonium trifluoromethane sulfonate . . . 0.06 g.

Quencher: triethanolamine . . . 0.002 g.

Solvent: propylene glycol monomethyl ether acetate . . . 20 g.

Next, as shown in FIG. 3A, the chemically amplified resist material is applied on a substrate 1, so as to form a resist film 2 with a thickness of 0.35 μm.

Then, as shown in FIG. 3B, the resist film 2 is subjected to pattern exposure by irradiating with exposing light 4 of ArF excimer laser with NA of 0.85 through a mask 3.

After the pattern exposure, as shown in FIG. 3C, the resist film 2 is baked by using a hot plate at a temperature of 105° C. for 60 seconds. Thereafter, the resultant resist film 2 is developed with a 2.38 wt % tetramethylammonium hydroxide developer. Thus, as shown in FIG. 3D, a resist pattern 2a with a line width of, for example, 0.08 μm made of an unexposed portion of the resist film 2 is obtained.

In the resist pattern 2a obtained by the pattern formation method using the conventional resist material, however, surface roughness and pattern roughness are frequently caused, resulting in degrading its shape (see, for example, G. Lee et al., Proc. SPIE. Vol. 5753, p. 390 (2005)).

When a resist pattern in such a degraded shape is used in etching, a pattern obtained in the etched film is also in a degraded shape, and hence, the productivity and the yield in the fabrication process for semiconductor devices are disadvantageously lowered.

SUMMARY OF THE INVENTION

In consideration of the aforementioned conventional disadvantage, an object of the invention is providing a resist material not suffering from the surface roughness and the pattern roughness when irradiated with exposing light of a 300 nm band or shorter wavelength.

It is noted that examples of the exposing light of the 300 nm band or shorter wavelength are deep UV such as KrF excimer laser (of a wavelength of a 248 nm band) and ArF excimer laser (of a wavelength of a 193 nm band); vacuum UV such as $F_2$ laser (of a wavelength of a 157 nm band), $Kr_2$ laser (of a wavelength of a 146 nm band), KrAr laser (of a wavelength of a 134 nm band) and $Ar_2$ laser (of a wavelength of a 126 nm band); and high energy beams (soft X-ray beams) of a wavelength not shorter than a 1 nm band and not longer than a 30 nm band or electron beams.

The present inventors have earnestly made examinations for achieving the object, resulting in finding the following: When a resist material is made of a polymeric material obtained by copolymerizing vinyl sulfonamide substituted with an acetal group, that is, an acid labile group, and non-substituted vinyl sulfonamide (shown in Chemical Formula 4 below), the resultant resist material is free from the surface roughness and the pattern roughness occurring through irradiation with the exposing light.

Chemical Formula 4:

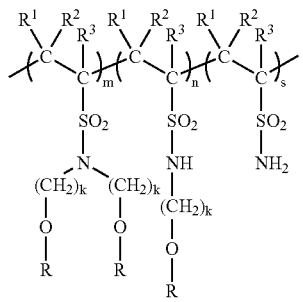

wherein $R^1$, $R^2$ and $R^3$ are the same or different and are a hydrogen atom, a fluorine atom, or a straight-chain alkyl group, a branched or cyclic alkyl group or a fluoridated alkyl group with a carbon number not less than 1 and not more than 20; R is a hydrogen atom, a straight-chain alkyl group, a branched or cyclic alkyl group or a fluoridated alkyl group with a carbon number not less than 1 and not more than 20; $m \geq 0$, $n \geq 0$, $s > 0$ (whereas excluding $m=n=0$) and $1 \leq k \leq 3$.

A sulfonamide group has high solubility and is smoothly dissolved. Therefore, when a part of sulfonamide is substituted with an acetal group labile with an acid, an exposed portion is more smoothly dissolved owing to non-substituted sulfonamide of the remaining part.

On the other hand, in an unexposed portion, the solubility of the non-substituted sulfonamide of the remaining part is inhibited by the part of the vinyl sulfonamide substituted with an acetal group, and hence, the dissolution contrast is increased. This high dissolution contrast attained by the smooth dissolution of the exposed portion and the insolubility of the unexposed portion can effectively suppress the surface roughness and the pattern roughness.

Furthermore, since a unit of the polymeric material used for forming the resist film is shared by the substituted and non-substituted sulfonamides, the exposed portion is uniformly dissolved, and this also suppresses the surface roughness and the pattern roughness. It is noted that a non-substituted sulfonamide group exhibits an effect to improve the adhesion of the pattern owing to its polarity.

Specifically, the resist material of this invention includes a polymeric material made of a unit represented by a general formula of the aforementioned Chemical Formula 4; and an acid generator for generating an acid through irradiation with light.

At this point, from the viewpoint of pattern formation characteristics, the ratio between a substituted unit and a non-substituted unit, namely, (m+n)/s, is preferably 15/85 through 70/30 and more preferably 20/80 through 60/40, which does not limit the invention.

The polymeric material included in the resist material of this invention can be fabricated by obtaining a polymer through polymerization of vinyl sulfonamide, that is, a monomer, and allowing an acetal group, that is, an acid labile group, to react with the polymer. In this fabrication method, the substitution ratio of the acetal group can be easily controlled to a desired ratio. Needless to say, the present invention is not limited to this fabrication method.

The acid generator included in the resist material of this invention may be an onium salt, which does not limit the invention. Examples of the onium salt are triphenylsulfonium trifluoromethane sulfonate, triphenylsulfonium nonafluorobutane sulfonate and triphenylsulfonium perfluorooctane sulfonate, which do not limit the invention. The ratio of the acid generator to the polymeric material is preferably approximately 1 wt % through 10 wt %.

The resist material of this invention may further include a dissolution inhibitor for inhibiting dissolution of the polymeric material. The dissolution inhibitor improves the dissolution contrast between an unexposed portion and an exposed portion of a resist film. An example of the dissolution inhibitor is bis-t-butyloxycarbonylated bisphenol A, which does not limit the invention. The ratio of the dissolution inhibitor to the polymeric material is preferably approximately 1 wt % through 10 wt %.

The first pattern formation method of this invention includes the steps of forming, on a substrate, a resist film made of a resist material including a polymeric material made of a unit represented by the general formula of Chemical Formula 4 and an acid generator for generating an acid through irradiation with light; performing pattern exposure by selectively irradiating the resist film with exposing light of a high energy beam of a wavelength not shorter than a 100 nm band and not longer than a 300 nm band or a wavelength not shorter than a 1 nm band and not longer than a 30 nm band or an electron beam; and forming a resist pattern by developing the resist film after the pattern exposure.

In the first pattern formation method, the resist material of this invention is used for forming a resist pattern in a good shape free from surface roughness and pattern roughness.

In the first pattern formation method, the high energy beam of the exposing light may be KrF excimer laser, ArF excimer laser, $F_2$ laser, $Kr_2$ laser, KrAr laser, $Ar_2$ laser or a soft X-ray beam.

The second pattern formation method of this invention includes the steps of forming, on a substrate, a resist film made of a resist material including a polymeric material made of a unit represented by the general formula of Chemical Formula 4 and an acid generator for generating an acid through irradiation with light; providing a liquid onto the resist film; performing, with the liquid provided on the resist film, pattern exposure by selectively irradiating the resist film with exposing light of a high energy beam of a wavelength not shorter than a 100 nm band and not longer than a 300 nm band; and forming a resist pattern by developing the resist film after the pattern exposure.

In the second pattern formation method, the pattern exposure is carried out with the liquid provided on the resist film, namely, through what is called immersion lithography, differently from the first pattern formation method. Also in the case where the immersion lithography is employed, a resist pattern can be formed in a good shape free from the surface roughness and the pattern roughness by using the resist material of this invention. In the immersion lithography, a region in an exposure system sandwiched between a projection lens and a resist film formed on a wafer is filled with a liquid having a refractive index larger than that of air, and therefore, the NA (the numerical aperture of the projection lens) of the exposure system can be theoretically increased to the refractive index of the liquid maximally. As a result, the resolution of the resist film can be improved. Furthermore, the depth of focus can be also increased in the immersion lithography.

In each of the first and second pattern formation methods, the resist material preferably further includes a dissolution inhibitor for inhibiting dissolution of the polymeric material.

In the second pattern formation method, the liquid is preferably water.

In this case, the high energy beam of the exposing light may be KrF excimer laser or ArF excimer laser.

Alternatively, in the second pattern formation method, the liquid is preferably perfluoropolyether.

In this case, the high energy beam of the exposing light may be $F_2$ laser, $Kr_2$ laser, KrAr laser or $Ar_2$ laser.

DETAILED DESCRIPTION OF THE INVENTION

Embodiment 1

A pattern formation method according to Embodiment 1 of the invention will now be described with reference to FIGS. 1A through 1D.

First, a positive chemically amplified resist material having the following composition is prepared:

Base polymer: poly(vinyl di(adamantoxymethylsulfonamide) (30 mol %)-vinyl sulfonamide (70 mol %)) . . . 2 g.

Acid generator: triphenylsulfonium trifluoromethane sulfonate . . . 0.06 g.

Quencher: triethanolamine . . . 0.002 g.

Solvent: propylene glycol monomethyl ether acetate . . . 20 g

Figure 1A:
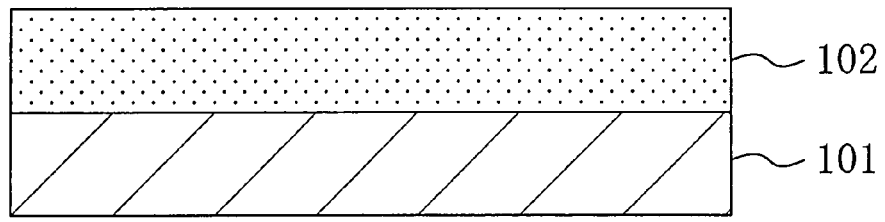
FIGS. 1A, 1B, 1C and 1D are cross-sectional views for showing procedures in a pattern formation method according to Embodiment 1 of the invention.

Next, as shown in FIG. 1A, the chemically amplified resist material is applied on a substrate 101, so as to form a resist film 102 with a thickness of 0.35 µm.

Figure 1B:
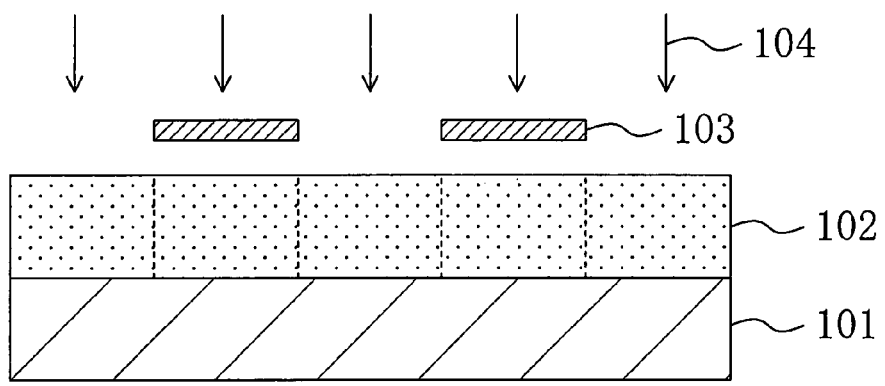

Then, as shown in FIG. 1B, the resist film 102 is subjected to pattern exposure by irradiating with exposing light 104 of ArF excimer laser having NA of 0.85 through a mask 103.

Figure 1C:
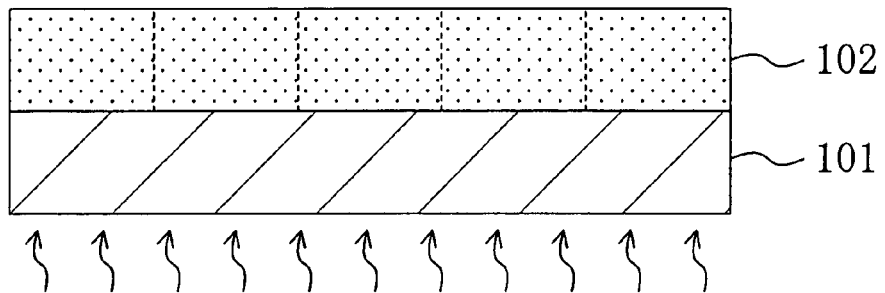
Figure 1D:
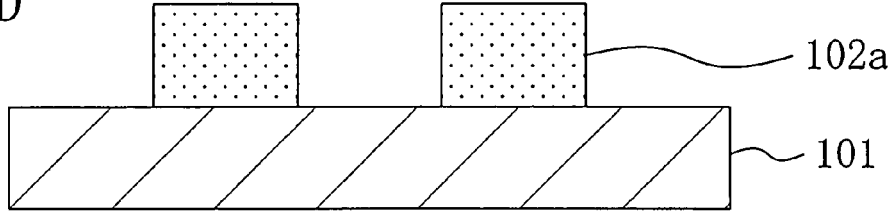

After the pattern exposure, as shown in FIG. 1C, the resist film 102 is baked by using a hot plate at a temperature of 105° C. for 60 seconds. Thereafter, the resultant resist film 102 is developed with a 2.38 wt % tetramethylammonium hydroxide developer. Thus, as shown in FIG. 1D, a resist pattern 102a made of an unexposed portion of the resist film 102 and having a line width of, for example, 0.08 μm is formed in a good shape free from surface roughness and pattern roughness.

In this manner, according to Embodiment 1, the base polymer of the chemically amplified resist material is a polymeric material obtained by copolymerizing vinyl di(adamantoxymethylsulfonamide) (30 mol %), that is, vinyl sulfonamide substituted with an acid labile group of an acetal group, and non-substituted vinyl sulfonamide (70 mol %).

Therefore, in an exposed portion of the resist film 102, the acetal group substituted in the base polymer is released by an acid generated from the acid generator, so as to smoothly dissolve the exposed portion. On the other hand, in an unexposed portion of the resist film 102, no acid is generated from the acid generator and hence the acetal group is not released, so as to inhibit the vinyl sulfonamide from dissolving. As a result, the surface roughness and the pattern roughness are minimally caused in the resist pattern 102a made of the unexposed portion, and the dissolution contrast between the exposed portion and the unexposed portion of the resist film 102 is improved.

The poly(vinyl di(adamantoxymethylsulfonamide) (30 mol %)-vinyl sulfonamide (70 mol %)) is used as the base polymer of the resist material in Embodiment 1, which does not limit the invention. For example, the base polymer may be poly(vinyl ethoxymethylsulfonamide (45 mol %)-vinyl sulfonamide (55 mol %)) or poly(vinyl di(adamantoxymethylsulfonamide) (10 mol %)-vinyl adamantoxyethylsulfonamide (60 mol %)) instead.

The above-described polymers are merely examples of the base polymer, and the ratio between a unit substituted with an acetal group and a non-substituted unit in the base polymer may be arbitrarily set.

The exposing light 104 is not limited to the ArF excimer laser but may be KrF excimer laser. Alternatively, $F_2$ laser, $Kr_2$ laser, KrAr laser or $Ar_2$ laser lasing at a shorter wavelength than the ArF excimer layer may be used instead.

Alternatively, soft X-ray beams of a wavelength not shorter than a 1 nm band and not longer than a 30 nm band or electron beams may be used instead.

Embodiment 2

A pattern formation method according to Embodiment 2 of the invention will now be described with reference to FIGS. 2A through 2D.

First, a positive chemically amplified resist material having the following composition is prepared:

Base polymer: poly(vinyl di(adamantoxymethylsulfonamide) (30 mol %)-vinyl adamantoxymethylsulfonamide (5 mol %)-vinyl sulfonamide (65 mol %)) . . . 2 g.

Acid generator: triphenylsulfonium trifluoromethane sulfonate . . . 0.06 g.

Quencher: triethanolamine . . . 0.002 g.

Solvent: propylene glycol monomethyl ether acetate . . . 20 g.

Figure 2A:
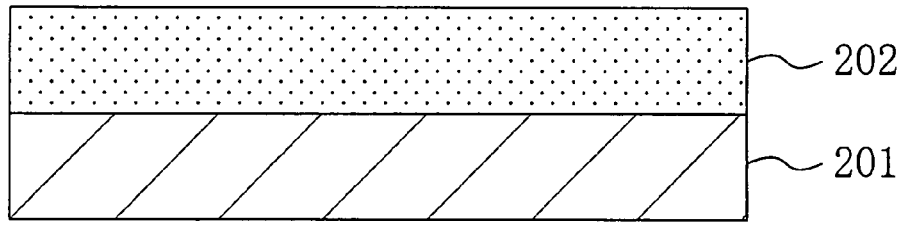
FIGS. 2A, 2B, 2C and 2D are cross-sectional views for showing procedures in a pattern formation method according to Embodiment 2 of the invention.

Next, as shown in FIG. 2A, the chemically amplified resist material is applied on a substrate 201, so as to form a resist film 202 with a thickness of 0.35 μm.

Figure 2B:
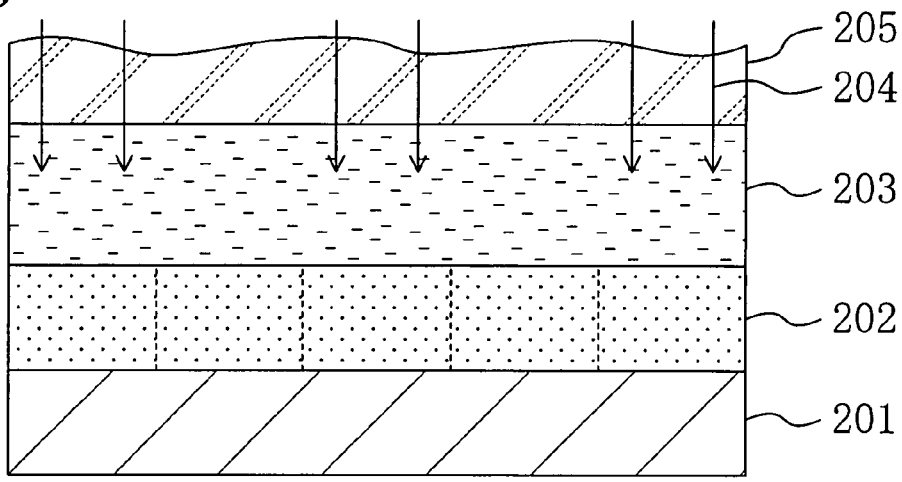

Then, as shown in FIG. 2B, an immersion liquid 203 of water is provided between the resist film 202 and a projection lens 205. Under these conditions, the resist film 202 is subjected to pattern exposure by irradiating with exposing light 204 of ArF excimer laser having NA of 0.85 through a mask not shown.

Figure 2C:
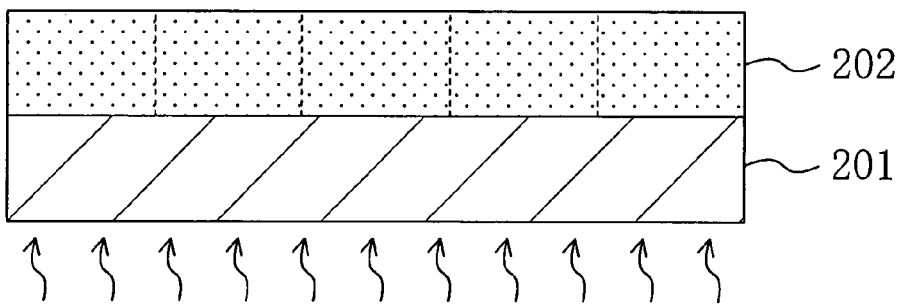
Figure 2D:
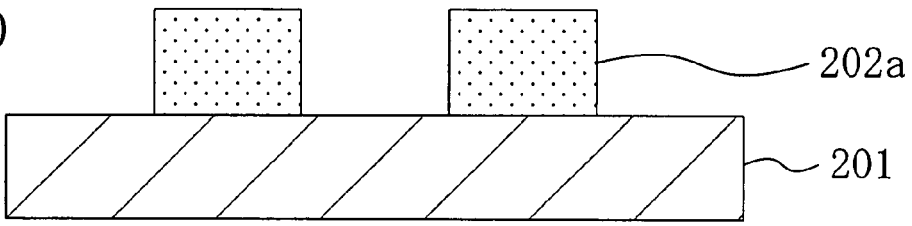
Figure 3A:
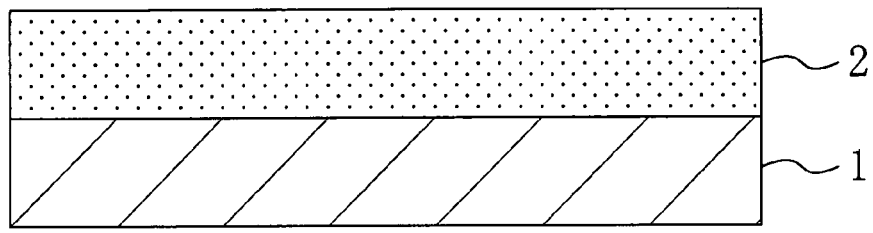
FIGS. 3A, 3B, 3C and 3D are cross-sectional views for showing procedures in a conventional pattern formation method.
Figure 3B:
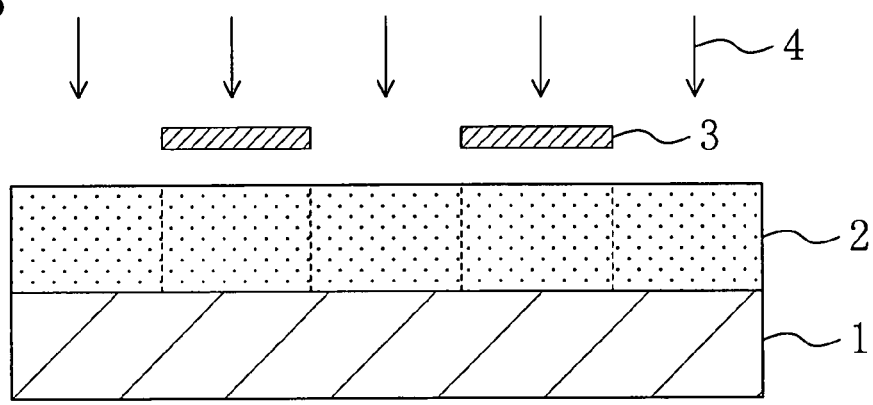
Figure 3C:
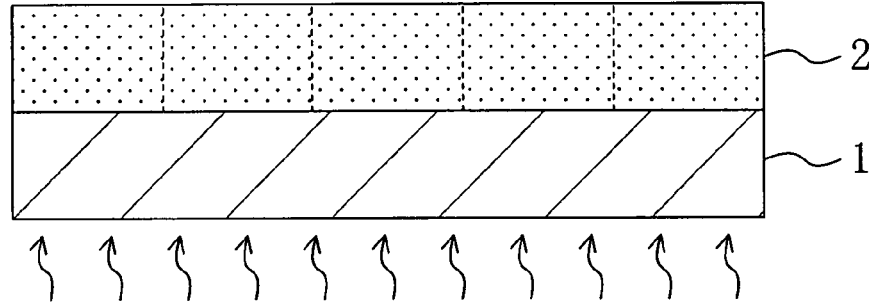
Figure 3D:
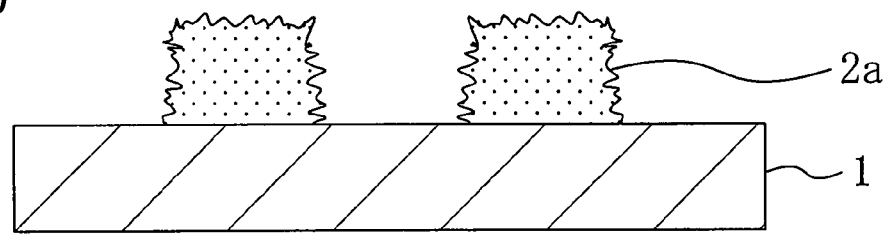

After the pattern exposure, as shown in FIG. 2C, the resist film 202 is baked by using a hot plate at a temperature of 105° C. for 60 seconds. Thereafter, the resultant resist film 202 is developed with a 2.38 wt % tetramethylammonium hydroxide developer. Thus, as shown in FIG. 2D, a resist pattern 202a made of an unexposed portion of the resist film 202 and having a line width of, for example, 0.08 μm is formed in a good shape free from the pattern roughness and the surface roughness.

In this manner, according to Embodiment 2, the base polymer of the chemically amplified resist material is a polymeric material obtained by copolymerizing vinyl di(adamantoxymethylsulfonamide) (30 mol %) and vinyl adamantoxymethylsulfonamide (5 mol %) substituted with an acid labile group of an acetal group, and non-substituted vinyl sulfonamide (65 mol %).

Therefore, in an exposed portion of the resist film 202, the acetal group substituted in the base polymer is released by an acid generated from the acid generator, so as to smoothly dissolve the exposed portion. On the other hand, in an unexposed portion of the resist film 202, no acid is generated from the acid generator and hence the acetal group is not released, so as to inhibit the vinyl sulfonamide from dissolving. As a result, the surface roughness and the pattern roughness are minimally caused in the resist pattern 202a made of the unexposed portion, and the dissolution contrast between the exposed portion and the unexposed portion of the resist film 202 is improved.

Also in Embodiment 2, the base polymer is not limited to the poly(vinyl di(adamantoxymethylsulfonamide) (30 mol %)-vinyl adamantoxymethylsulfonamide (5 mol %)-vinyl sulfonamide (65 mol %)) but may be any of the base polymers mentioned in Embodiment 1.

Furthermore, in the case where the immersion liquid 203 is water, the exposing light 204 may be KrF excimer laser instead of the ArF excimer laser.

In the case where the immersion liquid 203 is perfluoropolyether, the exposing light 204 may be $F_2$ laser, $Kr_2$ laser, KrAr laser or $Ar_2$ laser.

In each of Embodiments 1 and 2, the resist material may include a dissolution inhibitor of, for example, bis-t-butyloxycarbonylated bisphenol A. Thus, the dissolution contrast of the resist pattern can be further improved.

Although a positive resist material is used in each of Embodiments 1 and 2, a negative resist material may be used instead.

As described so far, in the resist material and the pattern formation method using the same according to the invention, a resist pattern can be formed in a good shape free from pattern roughness and surface roughness through irradiation with exposing light of a 300 nm band or shorter wavelength. Therefore, the invention is useful for a resist material and a pattern formation method using the same suitably employed in microprocessing technique for semiconductor devices.

What is claimed is:

1. A resist material comprising:
   a polymeric material made of a unit represented by a general formula of the following Chemical Formula 1; and
   an acid generator for generating an acid through irradiation with light:

Chemical Formula 1:

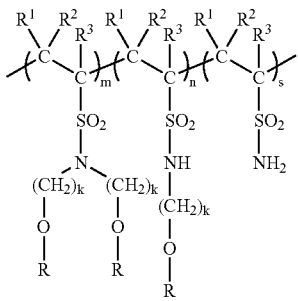

wherein $R^1$, $R^2$ and $R^3$ are the same or different and are a hydrogen atom, a fluorine atom, or a straight-chain alkyl group, a branched or cyclic alkyl group or a fluoridated alkyl group with a carbon number not less than 1 and not more than 20; R is a hydrogen atom, a straight-chain alkyl group, a branched or cyclic alkyl group or a fluoridated alkyl group with a carbon number not less than 1 and not more than 20; $m \geqq 0$, $n \geqq 0$, $s > 0$ (whereas excluding $m = n = 0$) and $1 \leqq k \leqq 3$.

2. The resist material of claim 1, further comprising a dissolution inhibitor for inhibiting dissolution of said polymeric material.

3. A pattern formation method comprising the steps of:
forming, on a substrate, a resist film made of a resist material including a polymeric material made of a unit represented by a general formula of the following Chemical Formula 2 and an acid generator for generating an acid through irradiation with light;
performing pattern exposure by selectively irradiating said resist film with exposing light of a high energy beam of a wavelength not shorter than a 100 nm band and not longer than a 300 nm band or a wavelength not shorter than a 1 nm band and not longer than a 30 nm band or an electron beam; and
forming a resist pattern by developing said resist film after the pattern exposure:

Chemical Formula 2:

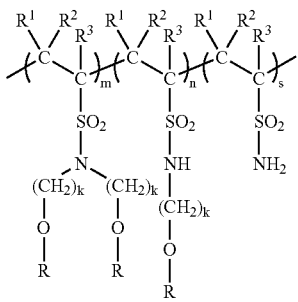

wherein $R^1$, $R^2$ and $R^3$ are the same or different and are a hydrogen atom, a fluorine atom, or a straight-chain alkyl group, a branched or cyclic alkyl group or a fluoridated alkyl group with a carbon number not less than 1 and not more than 20; R is a hydrogen atom, a straight-chain alkyl group, a branched or cyclic alkyl group or a fluoridated alkyl group with a carbon number not less than 1 and not more than 20; $m \geqq 0$, $n \geqq 0$, $s > 0$ (whereas excluding $m = n = 0$) and $1 \leqq k \leqq 3$.

4. The pattern formation method of claim 3, wherein said high energy beam of said exposing light is KrF excimer laser, ArF excimer laser, $F_2$ laser, $Kr_2$ laser, KrAr laser, $Ar_2$ laser or a soft X-ray beam.

5. The pattern formation method of claim 3, wherein said resist material further includes a dissolution inhibitor for inhibiting dissolution of said polymeric material.

6. A pattern formation method comprising the steps of:
forming, on a substrate, a resist film made of a resist material including a polymeric material made of a unit represented by a general formula of the following Chemical Formula 3 and an acid generator for generating an acid through irradiation with light;
providing a liquid onto said resist film;
performing, with said liquid provided on said resist film, pattern exposure by selectively irradiating said resist film with exposing light of a high energy beam of a wavelength not shorter than a 100 nm band and not longer than a 300 nm band; and
forming a resist pattern by developing said resist film after the pattern exposure:

Chemical Formula 3:

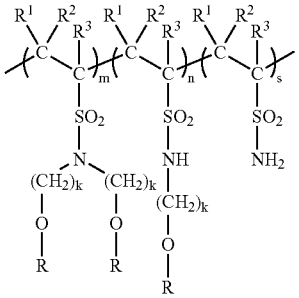

wherein $R^1$, $R^2$ and $R^3$ are the same or different and are a hydrogen atom, a fluorine atom, or a straight-chain alkyl group, a branched or cyclic alkyl group or a fluoridated alkyl group with a carbon number not less than 1 and not more than 20; R is a hydrogen atom, a straight-chain alkyl group, a branched or cyclic alkyl group or a fluoridated alkyl group with a carbon number not less than 1 and not more than 20; $m \geqq 0$, $n \geqq 0$, $s > 0$ (whereas excluding $m = n = 0$) and $1 \leqq k \leqq 3$.

7. The pattern formation method of claim 6, wherein said resist material further includes a dissolution inhibitor for inhibiting dissolution of said polymeric material.

8. The pattern formation method of claim 6, wherein said liquid is water.

9. The pattern formation method of claim 8, wherein said high energy beam of said exposing light is KrF excimer laser or ArF excimer laser.

10. The pattern formation method of claim 6, wherein said liquid is perfluoropolyether.

11. The pattern formation method of claim 10, wherein said high energy beam of said exposing light is $F_2$ laser, $Kr_2$ laser, KrAr laser or $Ar_2$ laser.

* * * * *